(12) United States Patent
Wajima

(10) Patent No.: US 6,610,925 B1
(45) Date of Patent: Aug. 26, 2003

(54) SURFACE MOUNTING ELECTRONIC COMPONENT

(75) Inventor: Masaya Wajima, Shinminato (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/705,584

(22) Filed: Nov. 3, 2000

(30) Foreign Application Priority Data

Nov. 18, 1999 (JP) .......................................... 11-328108

(51) Int. Cl.7 .............................................. H01L 23/02
(52) U.S. Cl. ..................................... 174/52.4; 174/52.1
(58) Field of Search ........................... 361/306.1, 308.1, 361/308.2, 309, 310; 174/52.4, 52.1; 338/272

(56) References Cited

U.S. PATENT DOCUMENTS 4,811,162 A * 3/1989 Maher et al. ............... 361/308

FOREIGN PATENT DOCUMENTS

| JP | 64-78011 | 3/1989 |
| JP | 3-240311 | 10/1991 |
| JP | 3-258107 | 11/1991 |
| JP | 3-117933 | 12/1991 |
| JP | 4-75425 | 7/1992 |
| JP | 9-298439 | 11/1997 |
| JP | 11-27078 | 1/1999 |
| JP | 11-298280 | 10/1999 |

* cited by examiner

Primary Examiner—Hung V. Ngo
(74) Attorney, Agent, or Firm—Keating & Bennett, LLP

(57) ABSTRACT

A surface mounting electronic component with external electrodes has a structure in which plated coatings are laminated on metallic coatings by a wet barrel plating method, so as to achieve reduced variation in thickness of the plated coatings of the plurality of external electrodes and reduced defective component frequency rate, with the result that materials for the plated coatings can be utilized efficiently. A plurality of external electrodes are disposed on the outer surfaces of an electronic component body. Each of the external electrodes includes metallic coatings and plated coatings disposed on the metallic coatings by a wet plating method. The area of each of the plurality of electrodes is approximately the same, and the total of lengths of each of the external electrodes on the edges of the electronic component body is approximately the same.

9 Claims, 13 Drawing Sheets

SURFACE MOUNTING ELECTRONIC COMPONENT

BACKGROUND OF THE INVENTION

1. Field of the Invention

The present invention relates to a surface mounting electronic component which is mounted on a surface of a printed circuit board or other suitable substrate, and a method of manufacturing the component. More specifically, the present invention relates to a surface mounting electronic component having external electrodes including plated coatings disposed on metallic coatings and a method for manufacturing such a component.

2. Description of the Related Art

Conventionally, various surface mounting electronic components have been proposed in order to realize smaller electronic apparatuses.

FIG. 14 is a perspective view illustrating an example of a conventional surface mounting electronic component.

In an electronic component 121, external electrodes 123–125 are disposed on the outer surfaces of an electronic component body 122. The external electrodes 123–125 have a laminated structure of metallic coatings with excellent electroconductivity and plated coatings located on the metallic coatings.

The above-described metallic coatings are composed of a metal with excellent electroconductivity such as Ag to ensure electrical connection with the electrodes (not shown in the drawing) located inside of the electronic component body 122. On the other hand, the plated coatings laminated on the metallic coatings are composed of Sn, an Sn—Pb alloy, or such material having excellent soldering properties.

Various configurations have been conventionally proposed for such external electrodes in the above-described surface mounting electronic component. For example, in the surface mounting electronic component described in Japanese Unexamined Patent Application Publication No. 3-258107, a plurality of external electrodes are arranged to wrap around the top surface, a pair of side surfaces and the bottom surface of an electronic component body. Similar surface mounting electronic components are disclosed in Japanese Unexamined Utility Model Application Publication Nos. 3-117933 and 4-75425.

However, in the representative conventional surface mounting electronic component 121 shown in FIG. 14, differences occur between the thicknesses of the above-described plated coatings in the external electrodes 123 and 125 disposed on the ends in the lengthwise direction and the thickness of the plated coating disposed in the external electrode 124 located in the center thereof. More specifically, the thicknesses of the plated coatings in the external electrodes 123 and 125 disposed on the ends in the lengthwise direction are larger than that of the plated coating in the external electrode 124 located in the center.

The above-described plated coatings are formed by wet type barrel plating. As shown in FIG. 15, metallic balls 126 as an electroconductive medium are contacted with metallic coatings 123A–125A to perform plating in the course of wet type barrel plating, wherein the metallic balls 126 are contacted with the metallic coatings 123A and 125A located on the ends in the lengthwise direction for a longer time than with the central metallic coating 124A. At the end of the plating process, this inevitably causes the thicknesses of the external electrodes 123 and 125 on the ends in the lengthwise direction to be larger than that of the external electrode 124 in the center as shown schematically in the lower portion of FIG. 15.

With such differences in the thickness of the plated coatings as shown above, the electronic components 121 stick to each other in the course of barrel plating, resulting in defective products. There are also problems such as increased variation in the configuration of the electronic components 121 finally obtained and increased cost caused by excessive consumption of materials required for plating.

SUMMARY OF THE INVENTION

In order to overcome the problems described above, preferred embodiments of the present invention provide a surface mounting electronic component with a plurality of external electrodes disposed on the outer surfaces of the electronic component constituting member, and each of the external electrodes having a structure in which plated coatings are laminated on metallic coatings by wet type barrel plating, wherein a plurality of external electrodes have very slight variations in thicknesses of the plated coatings. Thus, it is possible to reduce the frequency of defective components in the course of production, there are only slight variations in the appearance of the electronic components thus obtained, and materials for plating can be utilized efficiently, making it possible to reduce costs, and to provide a novel and advantageous method for producing the component.

According to a preferred embodiment of the present invention, a surface mounting electronic component includes an electronic component constituting member having a top surface, a bottom surface, a pair of side surfaces and a pair of end surfaces, and a plurality of external electrodes disposed on the outer surfaces of the electronic component constituting member and including metallic coatings and plated coatings disposed on the metallic coatings by a wet type plating method, the plurality of external electrodes are arranged at least on the bottom surface of the electronic component constituting member, and extend to reach the edges located between the bottom surface and the side surfaces, external electrodes located in the vicinities of the above-described end surfaces are located apart from each of the edges disposed between the end surfaces and the top surface, the bottom surface or the side surfaces, each external electrode has approximately the same area, and the total of the electrode lengths of sections of each external electrode is approximately the same, in which the sections are located on each of the edges disposed between the side surfaces and the upper or bottom surface of the electronic component constituting member.

According to another preferred embodiment of the present invention, a surface mounting electronic component including an electronic component constituting member having a top surface, a bottom surface, a pair of side surfaces and a pair of end surfaces, and n (where n is a natural number) external electrodes disposed on the outer surfaces of the electronic component constituting member and including metallic coatings and plated coatings disposed on the metallic coatings by a wet type plating method, each of the external electrodes is disposed at least on the bottom surface of the electronic component constituting member, and extends to reach the edges located between the bottom surface and the side surfaces, and n (where n is a natural number) of the external electrodes are aligned in the lengthwise direction, the lengthwise direction being determined along the line made by connecting a pair of end surfaces, each of the areas of the external electrodes is represented by $S_1$–$S_n$ with the relationships of $S_1 < S_2 \approx S_3 \ldots \approx S_{n-1}$ and $S_n < S_2 \approx S_3 \ldots \approx S_{n-1}$; and the total of the electrode lengths of sections of each external electrode is represented by $L_1$–$L_n$, with the relationships of $L_1 > L_2 \approx L_3 \ldots \approx L_{n-1}$ and $L_n > L_2 \approx L_3 \ldots \approx L_{n-1}$, in which the sections are located on each of the edges disposed between the side surfaces and the upper or bottom surface of the electronic component constituting member.

In a surface mounting electronic component according to the first and second preferred embodiments of the present invention (hereinafter referred to as "the present invention"), there are preferably notches formed on the external electrodes at the ends in the lengthwise direction of the electronic component constituting member. In a more specific preferred embodiment, the above-described notches are arranged to open toward the above-described end surfaces on the top surface of the electronic component constituting member.

Also, in a surface mounting electronic component according to various preferred embodiments of the present invention, the above-described electronic component constituting member may be an electronic component body, or a packaging member on which an electronic component element is to be mounted or in which it is to be stored. When the electronic component constituting member is a packaging member, an electronic component element is further mounted on or stored in the above-described packaging member.

According to another preferred embodiment of the present invention, a method for manufacturing a surface mounting electronic component includes the steps of forming metallic coatings for a plurality of external electrodes on the outer surfaces of an electronic component constituting member having a top surface, a bottom surface, a pair of side surfaces and a pair of end surfaces, and forming a plurality of external electrodes by forming plated coatings according to a wet type barrel plating method on the metallic coatings by putting metallic balls and the electronic component constituting member into a barrel pot, wherein, the plurality of metallic coatings are formed at least on the bottom surface of the electronic component constituting member, and extend to reach the edges disposed between the bottom surface and the side surfaces, metallic coatings formed in the vicinities of the end surfaces are located apart from each of the edges formed between the end surfaces and the top surface, the bottom surface or the side surfaces, and each metallic coating has approximately the same area, and the total of the lengths of sections of each metallic coating is approximately the same, in which the sections are located on the edges of the electronic component constituting member.

According to yet another preferred embodiment of the present invention, a method of manufacturing a surface mounting electronic component includes the steps of forming metallic coatings for a plurality of external electrodes on the outer surfaces of an electronic component constituting member having a top surface, a bottom surface, a pair of side surfaces and a pair of end surfaces, and forming a plurality of external electrodes by forming plated coatings according to a wet type barrel plating method on the metallic coatings by putting metallic balls and the electronic component constituting member into a barrel pot, wherein n (where n is a natural number) metallic coatings are aligned in the lengthwise direction, the lengthwise direction being determined along the line made by connecting a pair of end surfaces of the electronic component constituting member, each of the areas of the metallic coatings is represented by $S_1$–$S_n$, with the relationships of $S_1 < S_2 \approx S_3 \ldots \approx S_{n-1}$ and $S_n < S_2 \approx S_3 \ldots \approx S_{n-1}$; and the total of the electrode lengths of sections of each external electrode is represented by $L_1$–$L_n$ with the relationships of $L_1 > L_2 \approx L_3 \ldots \approx L_{n-1}$ and $L_n > L_2 \approx L_3 \ldots \approx L_{n-1}$, in which the sections are located on the edges of the electronic component constituting member.

In the methods for manufacturing a surface mounting electronic component according to the third and fourth preferred embodiments of the present invention, notches are formed preferably on the metallic coatings located on both ends in the lengthwise direction. In a more specific preferred embodiment, the notches are arranged to open toward the end surfaces on the top surface of the electronic component constituting member.

Also, in the methods according to the third and fourth preferred embodiments of the present invention, the above-described electronic component constituting member may be an electronic component body or a packaging member on which an electronic component element is to be mounted or in which it is to be stored.

Other features, elements, characteristics and advantages of the present invention will become more apparent from the following detailed description of preferred embodiments thereof with reference to the attached drawings.

DETAILED DESCRIPTION OF PREFERRED EMBODIMENTS

The present invention will be described below with reference to specific preferred embodiments of the present invention with reference to the drawings.

Figure 1:
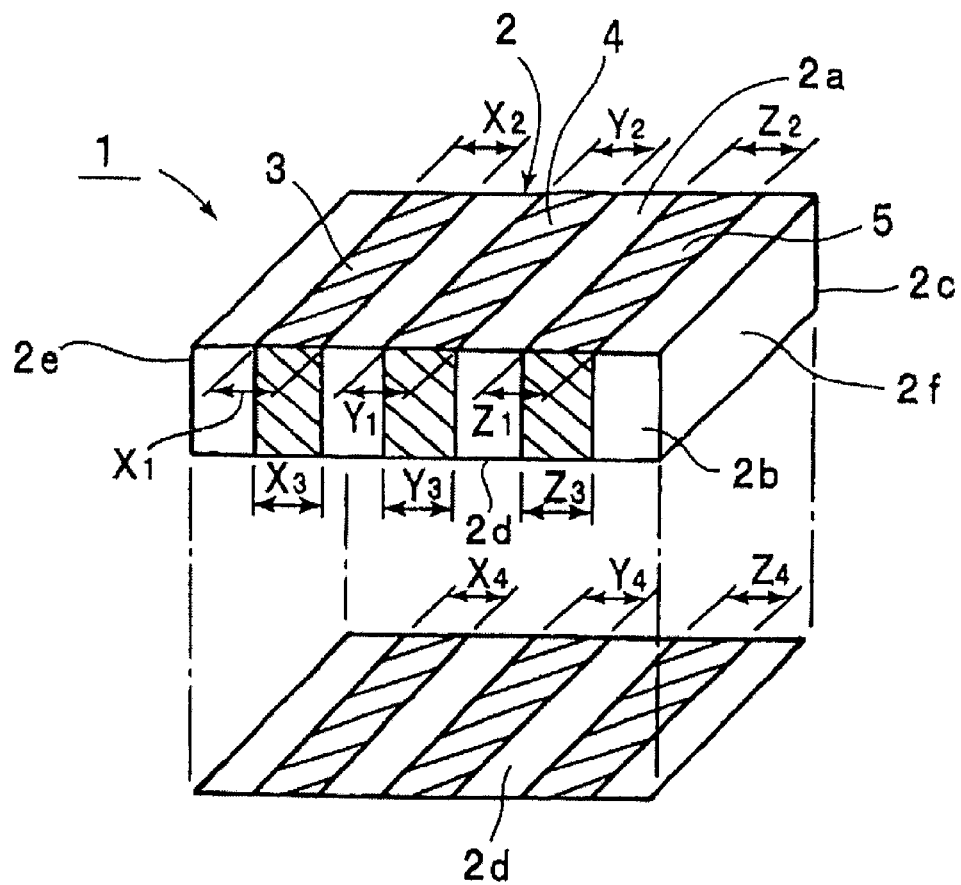
FIG. 1 is a schematic perspective view illustrating a surface mounting electronic component according to a first preferred embodiment of the present invention.

FIG. 1 is a schematic perspective view illustrating a chip-type piezoelectric oscillator as an example of the surface mounting electronic component according to a first preferred embodiment of the present invention.

In the piezoelectric oscillator 1 of this preferred embodiment, external electrodes 3–5 are disposed on the outer surfaces of an electronic component body 2. The electronic component body 2, which is schematically shown in FIG. 1, has a more specific structure shown in FIGS. 3A and 3B.

Figure 3A:
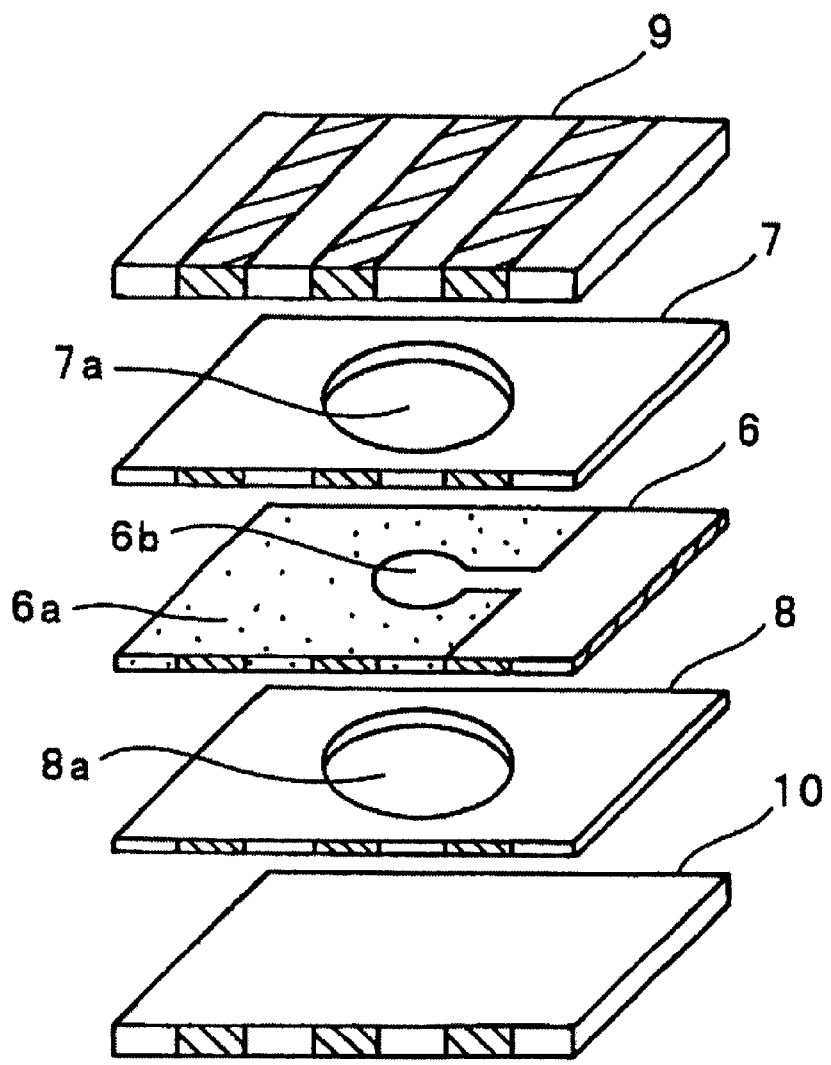
FIG. 3A is an exploded perspective view illustrating the structure of the surface mounting electronic component of the first preferred embodiment of the present invention.

Accordingly, as shown in the exploded perspective view of FIG. 3A, case substrates 9 and 10 are laminated over and under a piezoelectric resonator 6, with spacers 7 and 8 located in-between in the electronic component body 2. On the piezoelectric resonator 6, vibrating electrodes 6b are arranged on the main surfaces of a substantially rectangular piezoelectric substrate 6a so as to face each other and so that the piezoelectric substrate 6a is disposed therebetween. The piezoelectric substrate 6a is made of a piezoelectric ceramic material and is subjected to polarization treatment in the thickness direction thereof. Thus, the energy trap type piezoelectric resonator 6 utilizing the thickness longitudinal oscillation mode includes a pair of vibrating electrodes 6b.

Spacers 7 and 8 have openings 7a and 8a. The openings 7a and 8a are arranged to define a space in order not to prevent vibration of the vibration section of the piezoelectric resonator 6.

Case substrates 9 and 10 are preferably made of an insulating ceramic material such as alumina.

As shown above, the electronic component body 2 is constructed by bonding the above-described members with a bonding agent (not shown in the drawing).

Figure 3B:
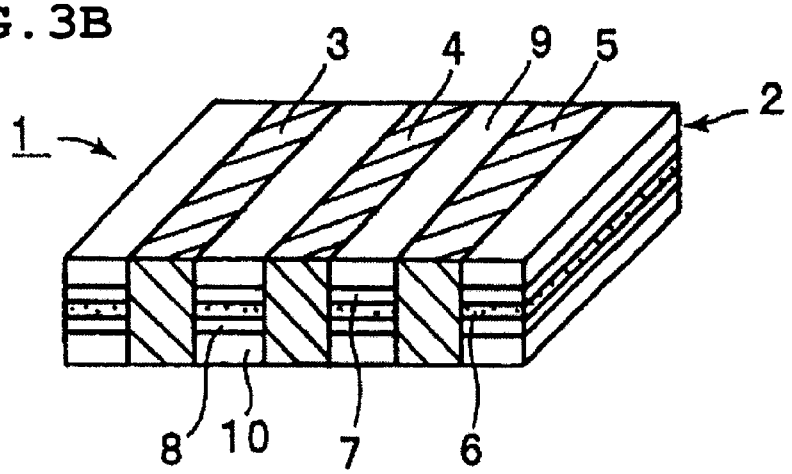
FIG. 3B is a perspective view showing the appearance of the electronic component according to the first preferred embodiment of the present invention.

On the outer surfaces of the above-described electronic component body 2, the above-described external electrodes 3–5 are provided (see FIG. 3B). The external electrode 3 is electrically connected with the vibrating electrode located on the bottom surface of the piezoelectric resonator 6. The external electrode 5 is electrically connected with the vibrating electrode 6b located on the top surface. The external electrode 4 is an external electrode connected with the ground electrode. A capacitor is provided between the external electrode 4 and the external electrodes 3 or 5, respectively.

Accordingly, the piezoelectric oscillator 1 constitutes a built-in load capacitor type, three-terminal piezoelectric oscillator.

One of the novel features of this preferred embodiment of the present invention is the external electrodes 3–5. Thus, in FIG. 1 and FIG. 2, as described later, the laminated structure of the electronic component body 2 is omitted in order to clearly show the dimensional relationship of the external electrodes.

Returning to FIG. 1, the external electrodes 3–5 are arranged to wrap around a top surface 2a, a pair of side surfaces 2b and 2c, and a bottom surface 2d of the electronic component body 2.

Also, the external electrodes 3–5 have a structure in which plated coatings are laminated on the metallic coatings. In this example, the metallic coatings preferably are composed of thick coatings formed by applying/baking an electroconductive paste such as an Ag paste, or of thin films formed by vapor deposition or sputtering a Ni alloy or other suitable material. Ni plated coatings and Sn plated coatings are laminated in this order by a wet type barrel plating method over the above-described metallic coatings.

Also, the external electrodes 3 and 5 are arranged to extend so as not to reach the end surfaces 2e and 2f of the electronic component body 2. Specifically in this example, the external electrodes 3 and 5 are located at a specific distance apart from the end surfaces 2e and 2f.

As described above, in the conventional surface mounting electronic component 121, the thickness of the plated coating was unavoidably larger at the external electrodes 123 and 125 located on the ends in the lengthwise direction of the electronic component body 122. On the other hand, in the piezoelectric oscillator 1 of the present preferred embodiment of the present invention, the thickness of the plated coating of the external electrodes 3 and 5 located on the ends in the lengthwise direction of the electronic component body 2 is substantially equal to that of the external electrode 4 located in the middle. Explanations of specific examples will be described in the following paragraph.

In this example, the total areas of the above-described external electrodes 3–5 are approximately the same. Taking the external electrode 3 as an example, the total area of each of the external electrodes refers to the total of the areas of the external electrode sections located on the top surface 2a, a pair of side surfaces 2b and 2c and the bottom surface 2d. Also, in the external electrodes 3–5, the total of the electrode lengths of each of the edges located between the top surface 2a and the side surface 2b or 2c and the electrode lengths of each of the edges located between the bottom surface 2d and the side surface 2b or 2c is approximately the same.

It is noted that the length refers to a dimension in the direction extending along an edge.

Here, taking the external electrode 3 as an example, the total X of the above-described electrode lengths is the total of the electrode lengths $X_1$–$X_4$ shown in FIG. 1. Similarly, the totals Y and Z of the above-described electrode lengths of the external electrodes 4 and 5 are $Y=Y_1+Y_2+Y_3+Y_4$, and $Z=Z_1+Z_2+Z_3+Z_4$, respectively.

Figure 2:
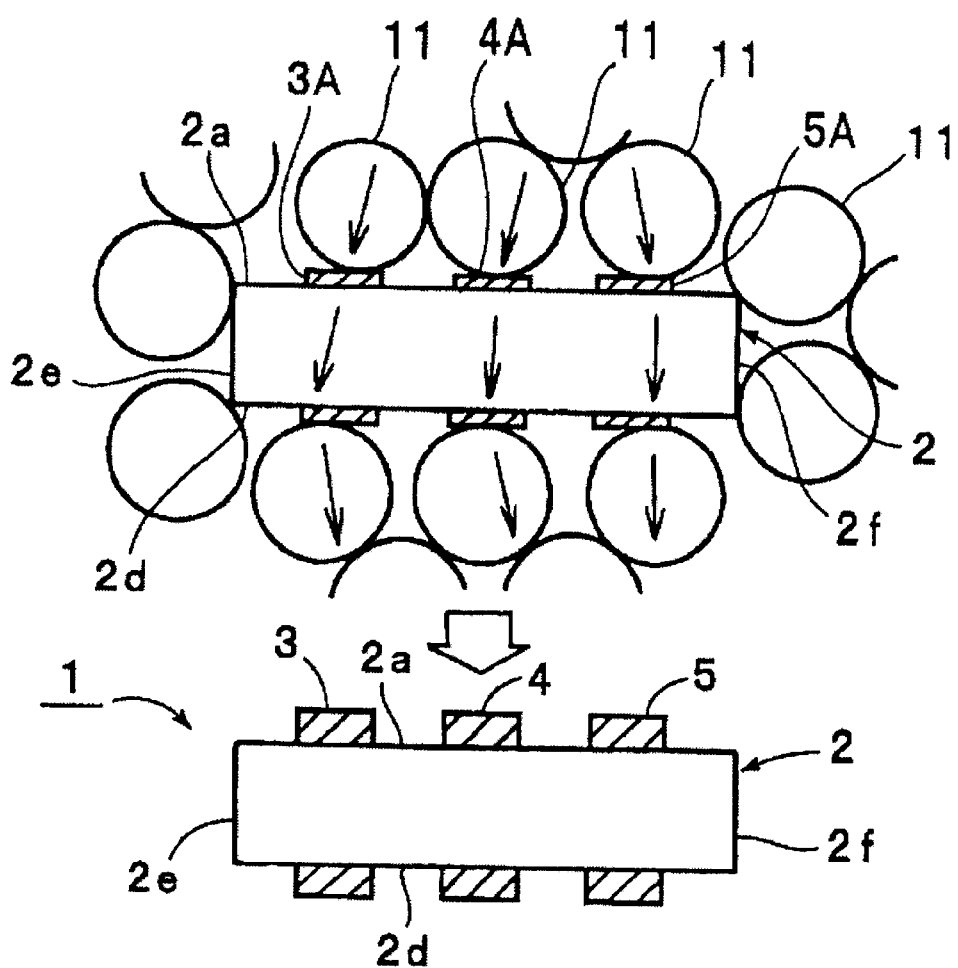
FIG. 2 is a schematic cross-sectional view illustrating a step for forming external electrodes in the first preferred embodiment by forming plated coatings on metallic coatings.

The method for forming the above-described external electrodes 3–5 will be explained by referring to FIG. 2. To make the external electrodes 3–5 have a laminated structure as shown above, the metallic coatings are first formed by applying/baking an electroconductive paste, or through a thin film forming method in the course of forming the external electrodes 3–5, so that they will have the same configuration as the electrodes finally obtained. The upper portion of FIG. 2 shows the state in which the metallic coatings 3A–5A are formed. The metallic coatings 3A–5A are constructed so that the external electrodes 3–5 are aligned to have approximately the same planar configuration.

After that, as shown in FIG. 2, the electronic component body 2 on which the metallic coatings 3A–5A are formed is put into a barrel pot for a wet type barrel plating method together with the metallic balls 11 as an electroconductive medium to form Ni plated coatings. Next, after the formation of the Ni plated coatings, it is placed into plating bath to form Sn plated coatings. Thus, the final external electrodes 3–5 are formed as shown in the lower portion of FIG. 2.

Here, it is noted that the probability of contact of the metallic balls 11 with the external electrode 4 is preferably approximately the same as those with the external electrodes 3 and 5, since the external electrodes 3–5 are arranged to not reach the end surface $2e$ or $2f$, and the above-described total areas of the external electrodes 3 and 5 are, respectively, approximately the same as that of the external electrode 4, and the total electrode lengths X, Y, and Z of the above-described external electrodes 3–5 have the relationship: $X \approx Y \approx Z$. Accordingly, Ni plated coatings and Sn plated coatings with a similar thickness can be formed on the metallic coatings 3A–5A.

Thus, the variation in thickness of the external electrodes 3–5 is minimized. Accordingly, the frequency of defective components caused by sticking of the piezoelectric oscillators 1 is also minimized in the course of barrel plating, and plating materials are conserved, thus achieving cost reduction, corresponding to much less variation in the thickness of plated coatings in the external electrodes 3–5. Additionally, variations in the configuration of the piezoelectric oscillator 1 finally obtained are also minimized.

The reason is as follows. Firstly, since the external electrodes 3 and 5 are arranged to extend so as not to reach the end surfaces $2e$ and $2f$, the probability of contact of the metallic balls 11 with the external electrodes 3 and 5 is greatly reduced as compared with the case of the conventional electronic component 121 in which the external electrodes are arranged to extend so as to reach the end surfaces, thus approaching probable contact of the metallic balls 11 with the external electrode 4. Secondly, the probability of contact of each of the external electrodes 35 with the metallic balls 11 is approximately the same, since the total areas of the external electrodes 3–5 are approximately the same, and the above-described total electrode lengths, X, Y, and Z for each of the external electrodes 3–5 are approximately the same.

Figure 4:
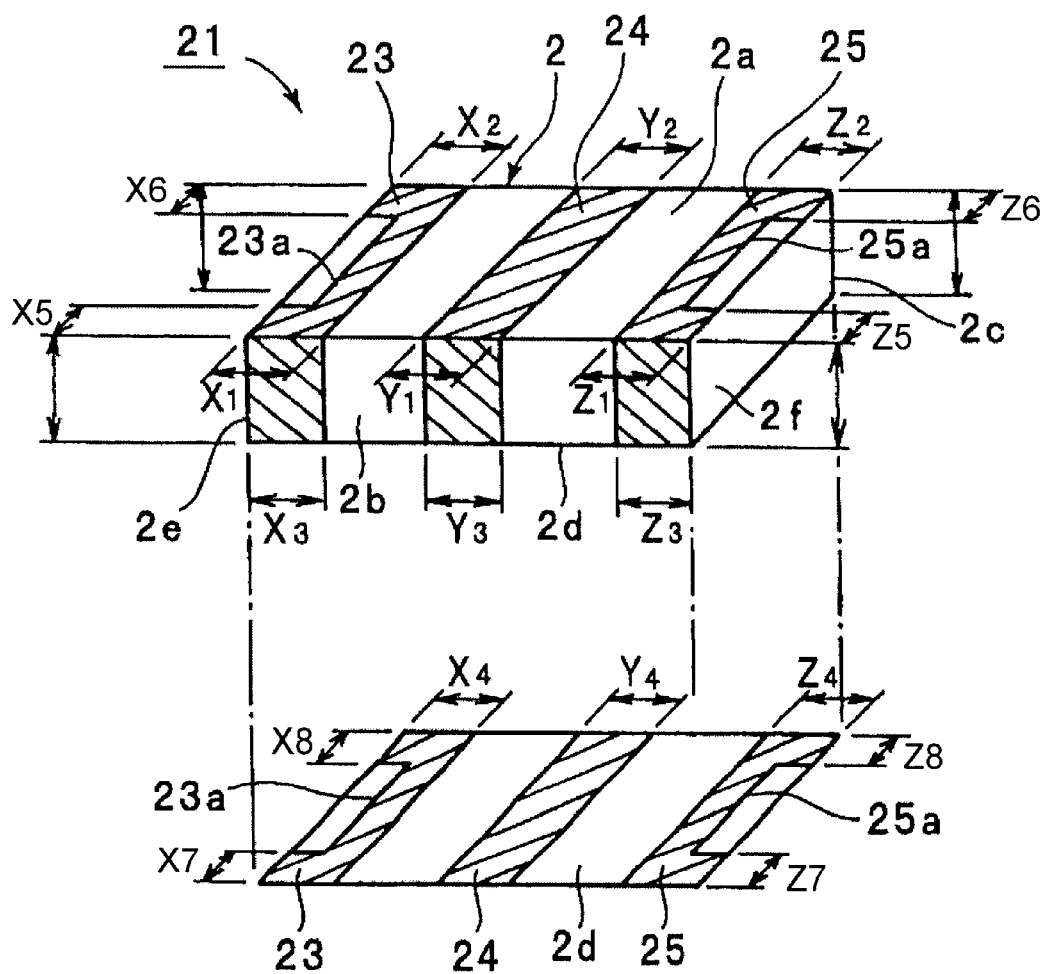
FIG. 4 is a schematic perspective view illustrating a surface mounting electronic component according to a second preferred embodiment of the present invention.

FIG. 4 is a perspective view illustrating the electronic component according to the second preferred embodiment of the present invention. The electronic component in the second preferred embodiment is a built-in load capacitor type piezoelectric oscillator which is similar to the one in the first preferred embodiment.

In the built-in load capacitor type piezoelectric oscillator 21 shown in FIG. 4, external electrodes 23–25 are disposed on the outer surfaces of an electronic component body 2. The electronic component body 2 is preferably constructed in substantially the same manner as that of the first example.

In this example, the area of the external electrode 24 is preferably larger than the total area of the external electrode 23 or 25. In other words, the relationship: $S_2 > S_1 \approx S_3$ is satisfied, when the area of the external electrode 23 is $S_1$, that of the external electrode 25 is $S_3$, and that of the external electrode 24 is $S_2$.

Also, the relationships: $L_1 > L_2$ and $L_3 > L_2$ are satisfied, when, regarding the external electrodes 3–5, the total of the electrode lengths on the edges located between a top surface $2a$ and a side surface $2b$ or $2c$, and the electrode lengths on the edges located between a bottom surface $2d$ and a side surface $2b$ or $2c$ refers to $L_1$–$L_3$. Taking the total of the electrode lengths $L_1$ as an example, the relationship: $L_1 = X_1 + X_2 + X_3 + X_4 + X_5 + X_6 + X_7 + X_8$ is satisfied.

Also, in the external electrodes 23 and 25, notches $23a$ and $25a$ are formed on the top surface $2a$ and the bottom surface $2d$, and open toward the end surfaces $2e$ and $2f$.

In this example, the probability of contact of the metallic balls 11 (see FIG. 2) as an electroconductive medium is made to be approximately the same among the external electrodes 23–25 in the plating step for forming the external electrodes 23–25, in the same manner as in the first preferred embodiment, since the external electrodes 23–25 are formed as shown above. This is because the external electrode 24 is arranged to not reach the end surface $2e$ or $2f$, the external electrodes 23 and 25 have the notches $23a$ and $25a$ which open toward the end surfaces $2e$ and $2f$, that is, toward the outer sides of the lengthwise direction, and therefore, the probabilities of contact of the external electrodes 23 and 25 as well as of the external electrode 24 with the metallic balls 11 are made to be approximately equal. More specifically, the probability of contact of the area of the external electrode 24 with the metallic balls is larger than those for the external electrodes 23 and 25, since the above-described $S_1$ and $S_3$ are made to be smaller than $S_2$ by virtue of the notches $23a$ and $25a$, while the probabilities of contact of the edges of the external electrodes 23 and 25 with the metallic balls are larger than that of the external electrode 24, since it is established that $L_1 > L_2$ and $L_3 > L_2$. Therefore, the probability of contact of each external electrode with the metallic balls is kept approximately equal as a whole.

Accordingly, in the piezoelectric oscillator 21 according to the second preferred embodiment, the thicknesses of plated coatings of the external electrodes 23–25 are approximately equal as in the case of the piezoelectric oscillator 1 in the first example. Therefore, the occurrence of defective components caused by sticking between the piezoelectric oscillators 21 in the course of plating is minimized. Materials for plating are also conserved, and thus cost reduction is achieved, and variations in configuration of the piezoelectric oscillators 21 finally obtained are greatly reduced.

In addition, a smaller portion can be constructed as compared with the piezoelectric oscillator 1 of the first preferred embodiment, since the external electrodes 23 and 25 are arranged so as to be exposed to the end surfaces $2e$ and $2f$.

In the second preferred embodiment, the above-described notches $23a$ and $25a$ are preferably formed on the external electrodes 23 and 25. However, the notches may be omitted.

In the first and second preferred embodiments, the electronic component body 2 preferably has a structure in which the piezoelectric resonator 6, the spacers 7 and 8 and the case substrates 9 and 10 as shown in FIG. 3 are laminated. However, it is noted that the present invention does not pose any limit to the structure of the electronic component body.

FIGS. 5–9 are views illustrating examples of surface mounting electronic components according to various preferred embodiments of the present invention.

Figure 5:
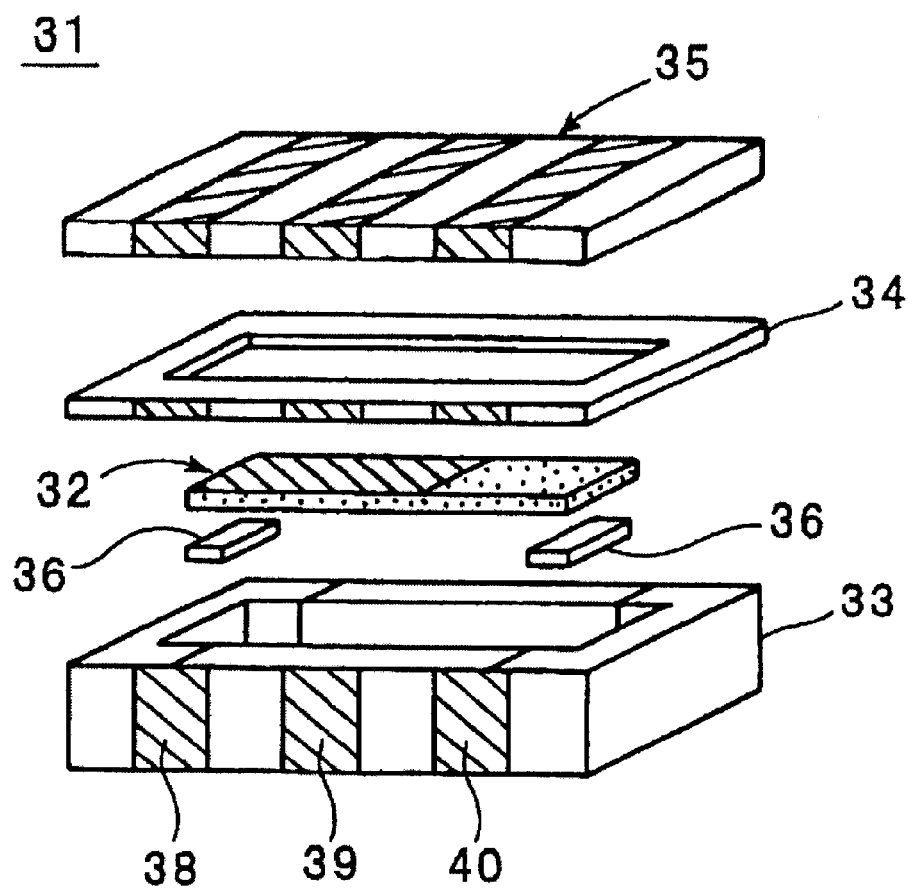
FIG. 5 is an exploded perspective view illustrating another example of a surface mounting electronic component according to another preferred embodiment of the present invention.
Figure 6:
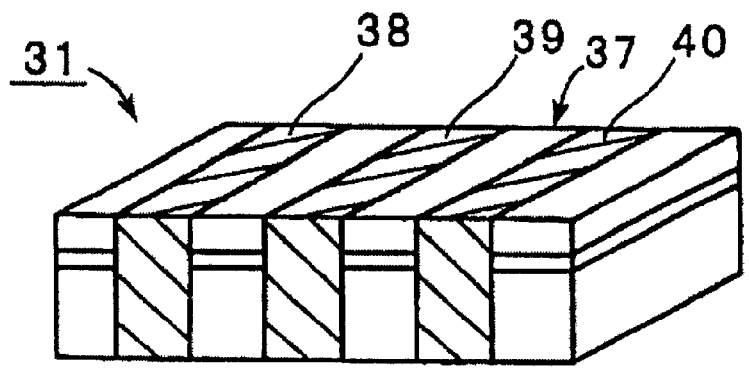
FIG. 6 is a perspective view showing the appearance of the surface mounting electronic component shown in FIG. 5.

In a surface mounting electronic component 31 shown in FIGS. 5 and 6, a piezoelectric resonator 32 vibrating in a thickness slide mode is stored in a container including a body of case 33 with an opening facing upward, a spacer 34 and also a cover member 35, thus defining an electronic component body 37. It is noted that the reference numerals 36s refer to electroconductive bonding members.

Here, external electrodes 38–40 are disposed on the outer surfaces of the electronic component body 37. These external electrodes 38–40 are constructed in manner similar to that of the first or second preferred embodiments of the present invention.

Figure 7A:
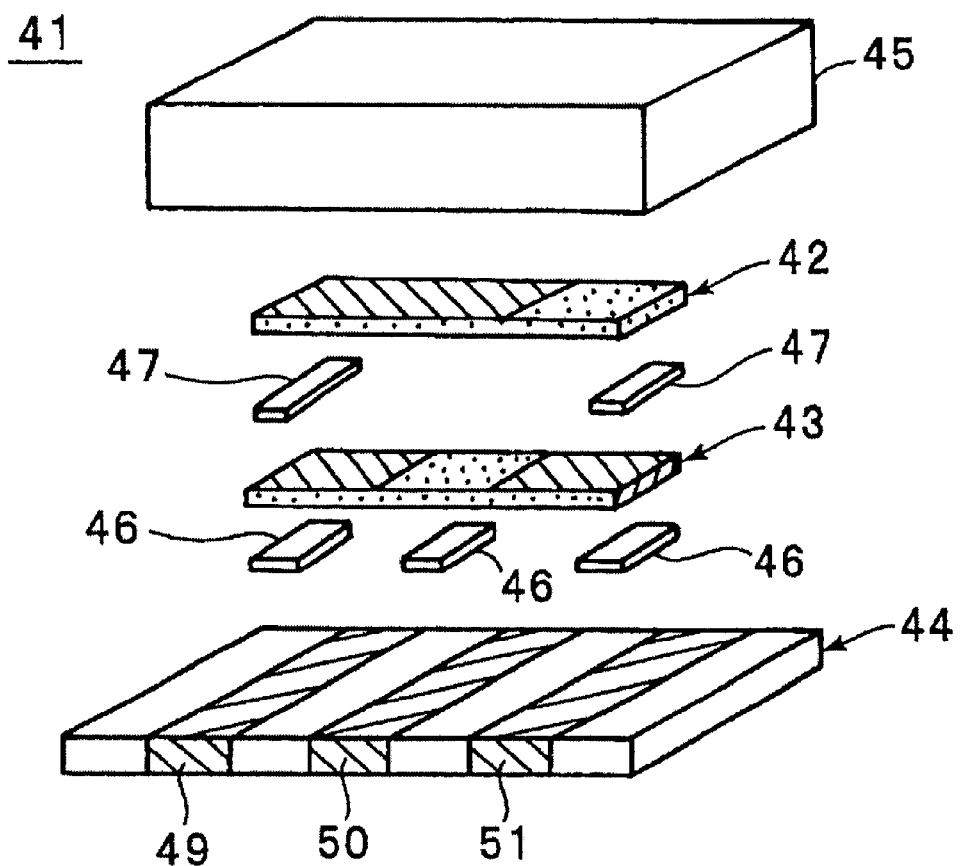
FIG. 7A is an exploded perspective view illustrating still another preferred embodiment of a surface mounting electronic component according to the present invention.
Figure 7B:
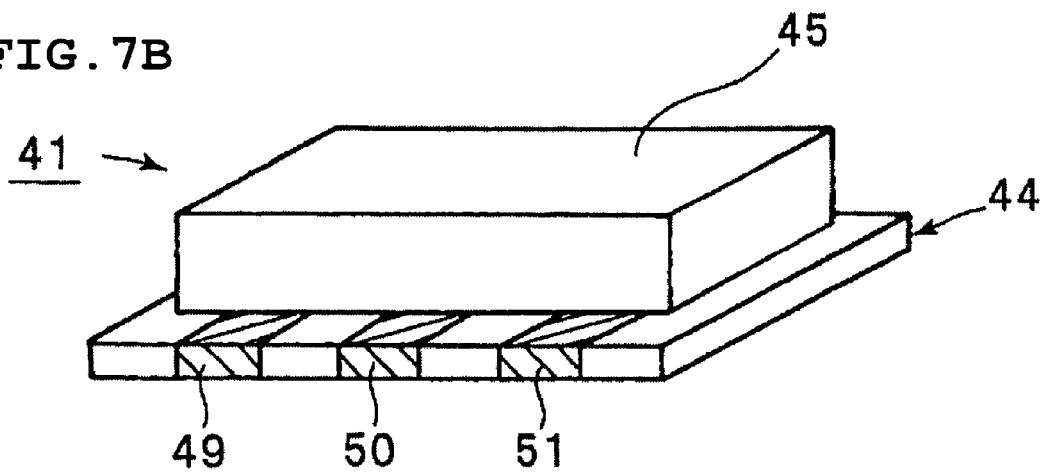
FIG. 7B is a perspective view showing the appearance of the electronic component shown in FIG. 7A.

In the surface mounting electronic component 41 shown in FIGS. 7A and 7B, a piezoelectric resonator 42 vibrating in the thickness slide mode and a capacitor element 43 including a pair of capacitors connected with the piezoelectric resonator 42 are stored in a package including a case substrate 44 and a cap 45 with an opening facing downward. It is noted that the reference numerals 46 and 47 refer to electroconductive bonding members.

Here, external electrodes 49–51 are disposed on the outer surfaces of the case substrate 44 as a packaging member. The external electrodes 49–51 are also arranged so as to cover the top surface, a pair of side surfaces and the bottom surface of the case substrate 44, and preferably are constructed in a manner similar to that of the first and second preferred embodiments of the present invention.

Figure 8A:
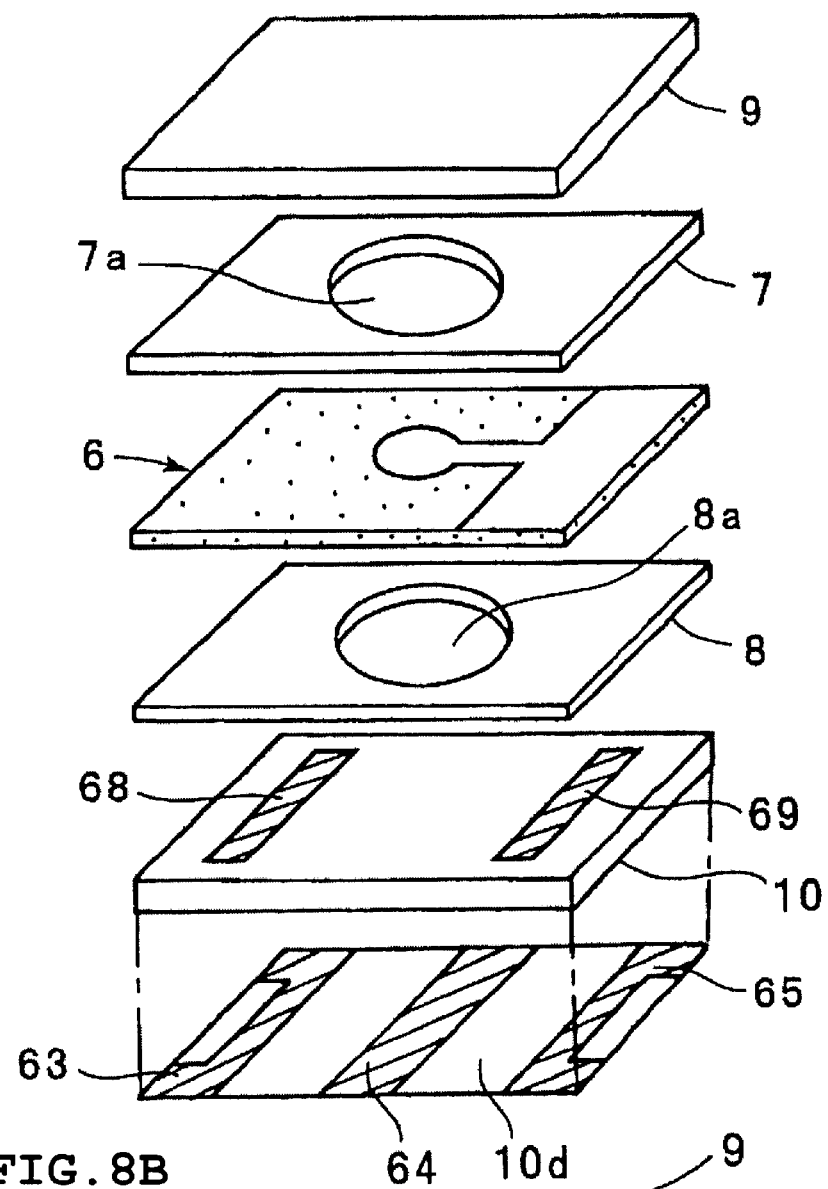
FIG. 8A is an exploded perspective view illustrating still another preferred embodiment of a surface mounting electronic component according to the present invention.
Figure 8B:
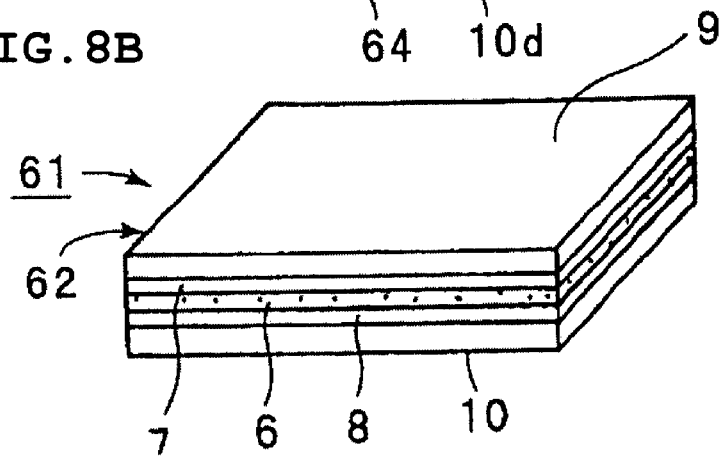
FIG. 8B is a perspective view showing the appearance of the electronic component of FIG. 8A.

In an electronic component 61 shown in FIGS. 8A and 8B, anisotropically electroconductive bonding members 7 and 8 are laminated as spacers over and under an energy trap type piezoelectric resonator 6 vibrating in the thickness longitudinal oscillation mode, and case substrates 9 and 10 are disposed further over and further below, while a plurality of external electrodes 63–65 are disposed on a bottom surface 10d of the case substrate 10, in an electronic component body 62 in which these elements are laminated. The external electrodes 63–65 are preferably constructed in a manner similar to that of the first or second preferred embodiments of the present invention. In this preferred embodiment of the present invention, therefore, the external electrodes disposed on the outer surfaces of the electronic component body may be formed only on the bottom surface.

Figure 9:
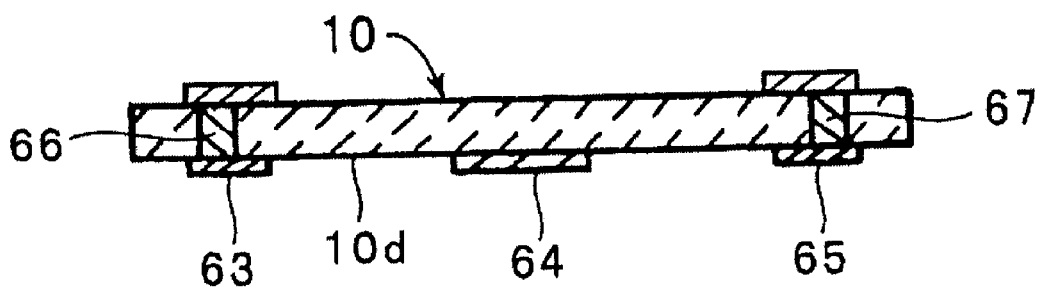
FIG. 9 is a schematic cross-sectional view illustrating a case substrate of the surface mounting electronic component shown in FIGS. 8A and 8B.

Furthermore, the external electrodes 63 and 65 are electrically connected with the joint electrodes 68 and 69 disposed on the top surface of the case substrate 10 through hole electrodes 66 and 67 located on the case substrate 10, as in the cross-sectional view illustrated in FIG. 9. The joint electrodes 68 and 69 are electrically connected with vibrating electrodes of the piezoelectric resonator 6.

Each of FIGS. 10–13 is a schematic perspective view illustrating a modified example of a surface mounting electronic component according to preferred embodiments of the present invention. In a surface mounting electronic component 71 shown in FIG. 10A, external electrodes 73–75 are disposed on the outer surfaces of an electronic component body 72. The external electrodes 73–75 are disposed to extend from the bottom surface of the electronic component body 72 over a pair of side surfaces to the top surface, and have protrusions 73a, 74a, 74b and 75a on the bottom surface.

Figure 10A:
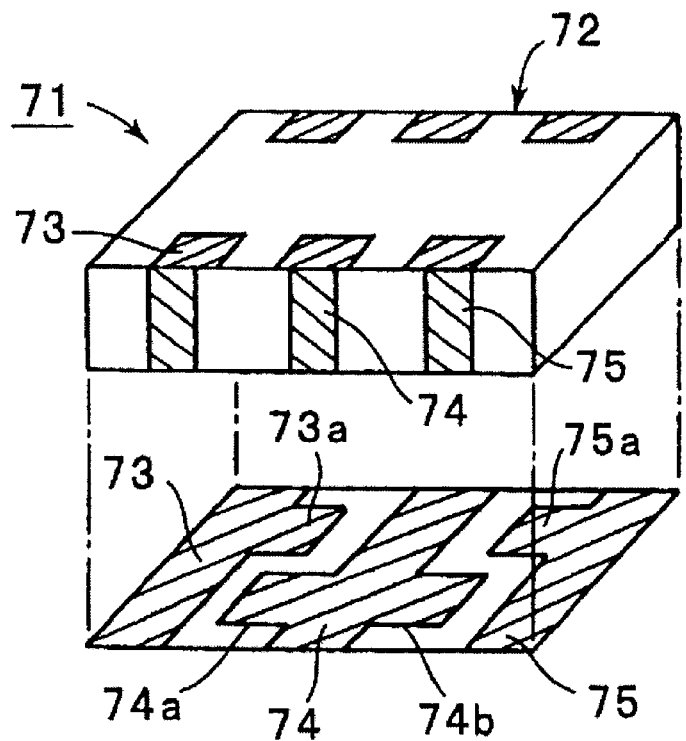
FIGS. 10A and 10B are schematic perspective views illustrating a modified example of an external electrode according to a preferred embodiment of the present invention.
Figure 10B:
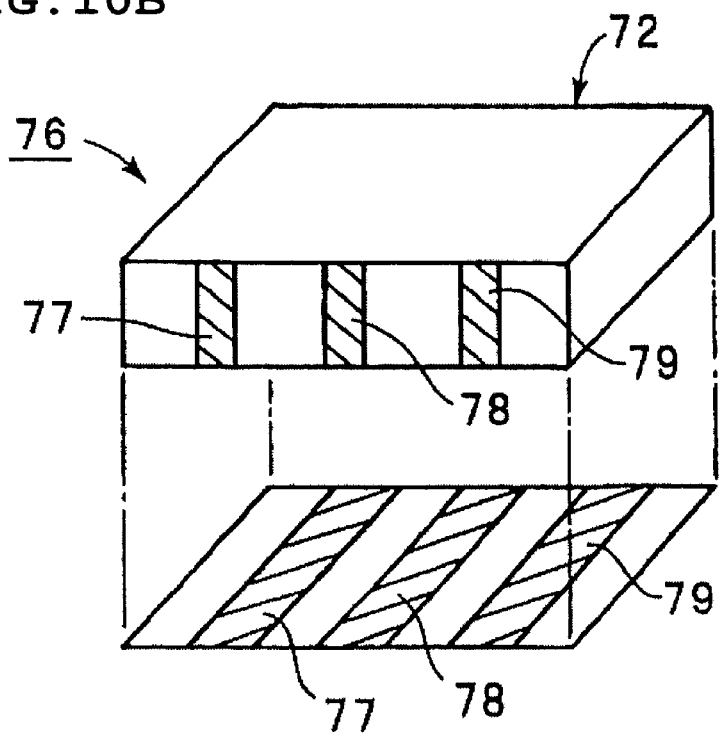

In a surface mounting electronic component 76 shown in FIG. 10B, a plurality of external electrodes 77–79 are arranged to extend so as to cover one of the side surfaces and the bottom surface of an electronic component body 72.

Figure 11A:
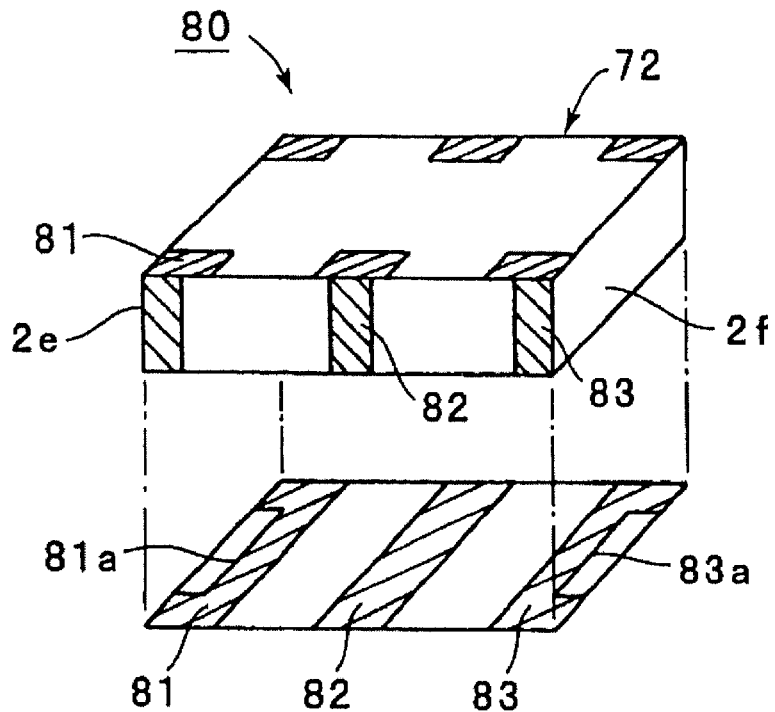
FIGS. 11A and 11B are schematic perspective views illustrating another modified example of an external electrode according to another preferred embodiment of the present invention.

In a surface mounting electronic component 80 shown in FIG. 11A, a plurality of external electrodes 81–83 are arranged on the outer surfaces of an electronic component body 72. The external electrodes 81–83 are arranged to extend from the bottom surface of the electronic component body 72 over a pair of side surfaces to the top surface. On the external electrodes 81 and 83, notches 81a and 83a are disposed on a portion of the bottom surface of the electronic component body 72, which are open toward the end surfaces 2e and 2f.

Figure 11B:
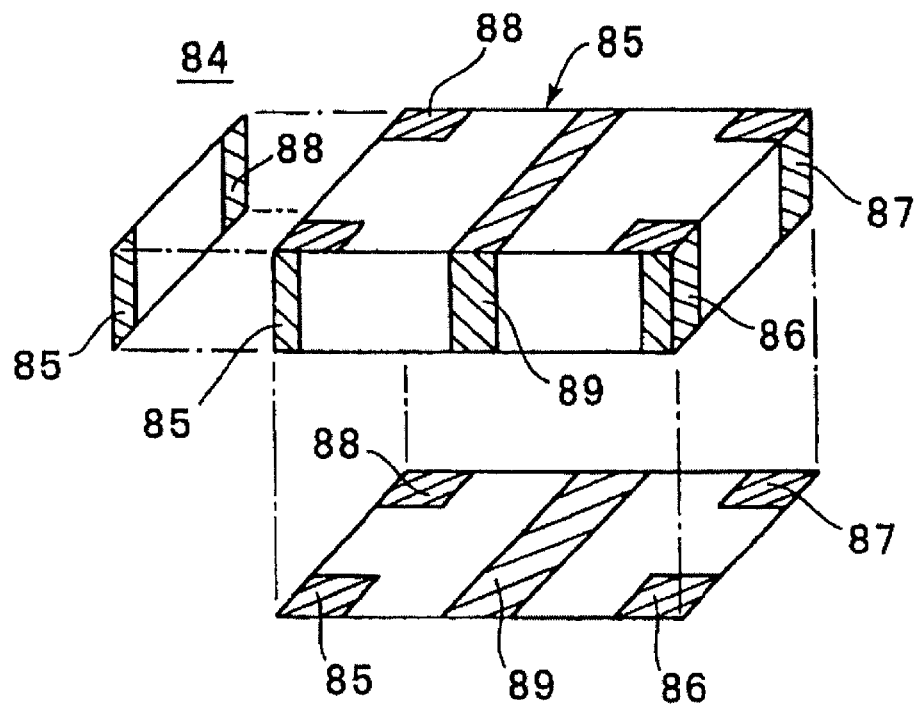

In a surface mounting electronic component 84 shown in FIG. 11B, external electrodes 85–88 are disposed on the corner portions of an electronic component body 850, extending to cover the top surface, the end surfaces, one of the side surfaces and the bottom surface. The external electrode 89 is disposed at the approximately central portion in the lengthwise direction of the electronic component body 72, extending to cover the top surface, a pair of side surfaces and the bottom surface.

Figure 12A:
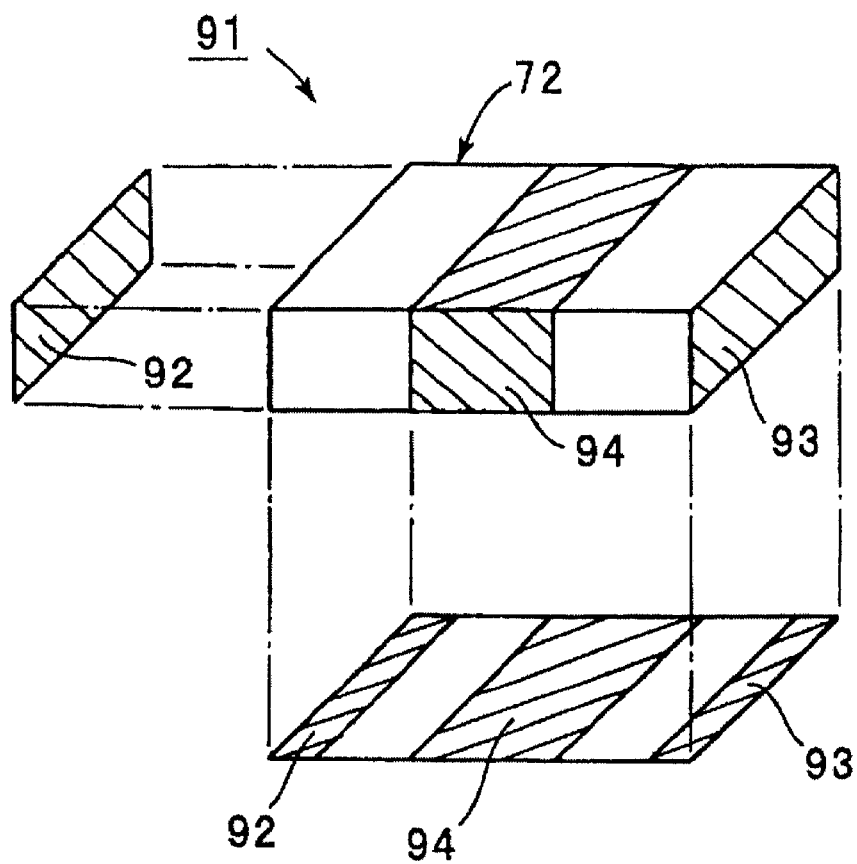
FIGS. 12A and 12B are schematic perspective views illustrating still another modified example of an external electrode according to another preferred embodiment of the present invention.

In a surface mounting electronic component 91 shown in FIG. 12A, an external electrode 92 is arranged on one of the ends in the lengthwise direction of an electronic component body 72, extending to cover the end surface and the bottom surface, an external electrode 93 is disposed on the other end surface, extending to cover the end surface and the bottom surface, and an external electrode 94 is disposed at the approximately central portion in the lengthwise direction of the electronic component body 72, extending to cover the top surface, a pair of side surfaces, and the bottom surface.

Figure 12B:
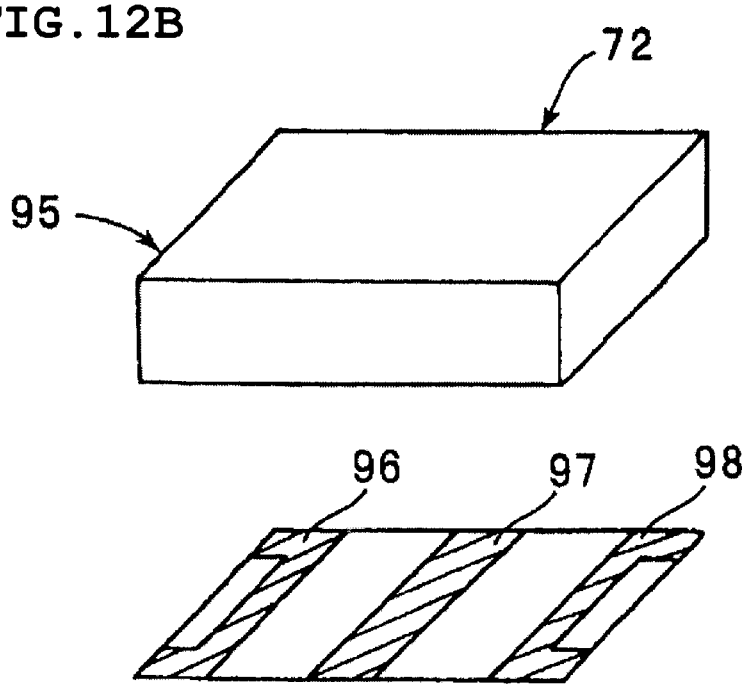

In a surface mounting electronic component 95 shown in FIG. 12B, a plurality of external electrodes 96–98 are disposed on the bottom surface of an electronic component body 72.

Figure 13:
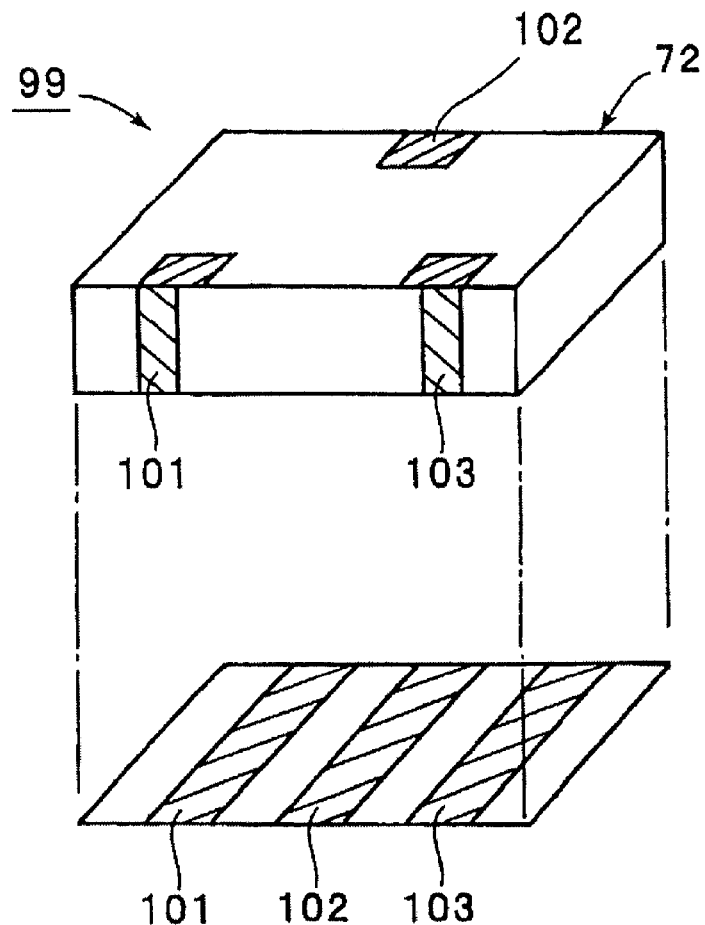
FIG. 13 is a schematic perspective view illustrating still another example to show the configuration of an external electrode of a surface mounting electronic component according to a preferred embodiment of the present invention.
Figure 14:
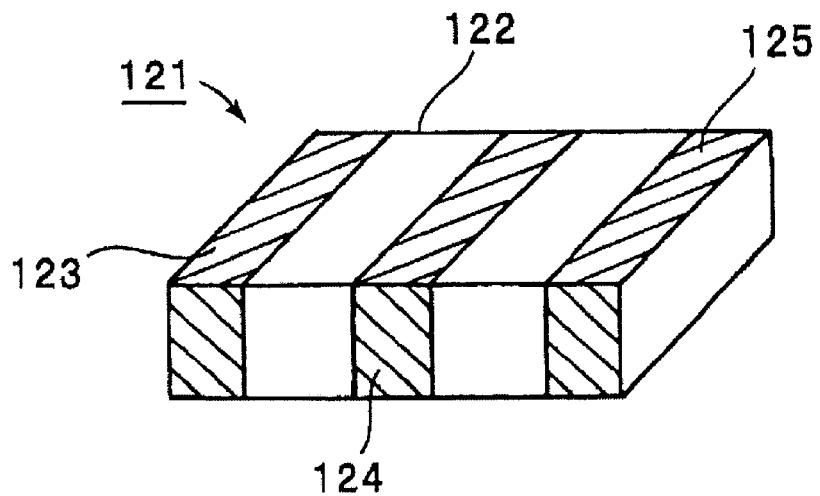
FIG. 14 is a perspective view illustrating an example of a conventional surface mounting electronic component.
Figure 15:
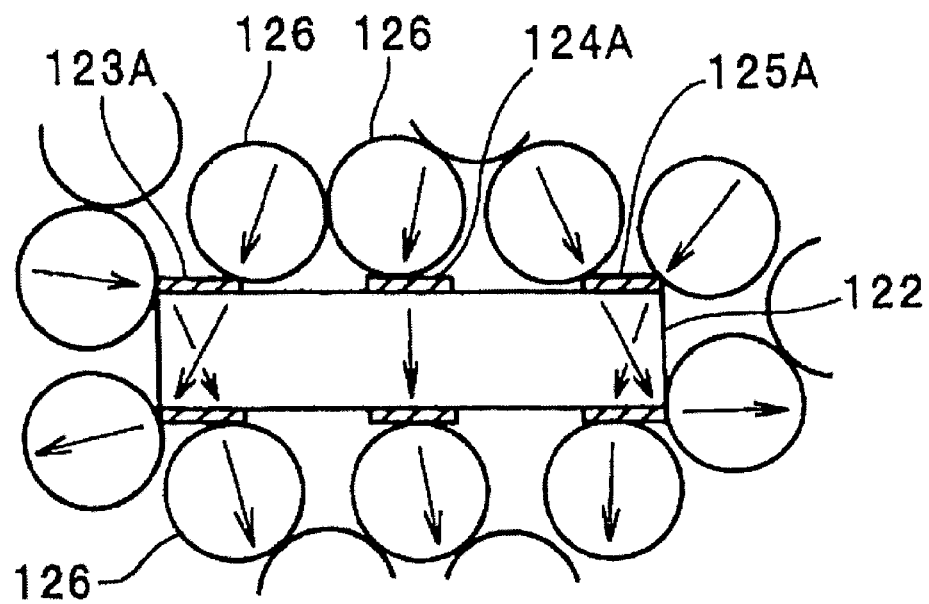
FIG. 15 is a schematic cross-sectional view illustrating a step of forming external electrodes by forming plated coatings on metallic coatings in the conventional surface mounting electronic component shown in FIG. 14.
Figure 15:
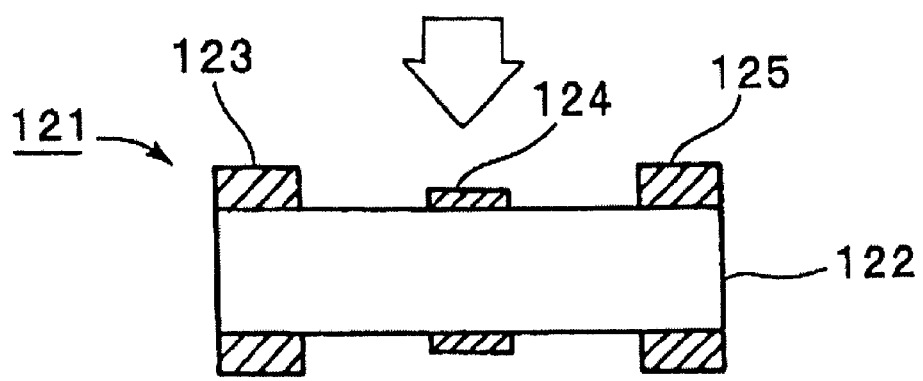

In a surface mounting electronic component 99 shown in FIG. 13, external electrodes 101–103 are disposed on the bottom surface of an electronic component body 72. The external electrodes 101–103 are arranged to extend so as to cover the entire width of the bottom surface of the electronic component body 72 and to extend over one of the side surfaces to the top surface.

In each of surface mounting electronic components shown in FIGS. 10–13, variations in thicknesses of plated coatings on the metallic coatings of each of the external electrodes are minimized, and the defective component rate caused by variation in thickness of the plated coatings is greatly reduced as in the first and second preferred embodiments, by constructing the above-described plurality of external electrodes in a manner to satisfy the conditions set forth in the first and second preferred embodiments of the present invention. Furthermore, differences in the configuration of the surface mounting electronic components finally obtained are greatly reduced.

It is noted that the present invention can be applied not only to an electronic component utilizing a piezoelectric resonator but also broadly to a surface mounting electronic component utilizing other electronic component elements such as a capacitor element and a resistive element.

In the surface mounting electronic component according to the first preferred embodiment of the present invention obtained by the production method according to the third preferred embodiment of the present invention, a plurality of external electrodes are disposed on the outer surfaces of the electronic component constituting member, including metallic coatings and plated coatings formed on the metallic coatings by a wet type plating method, external electrodes located in the vicinities of the end surfaces of the electronic component constituting member are located apart from each of the edges formed between the end surfaces and the top surface, the bottom surface or a pair of side surfaces, the area of each of the external electrodes is made to be approximately equal, and the total of the electrode lengths of sections of each external electrode located on the edges of the electronic component constituting member is made to be approximately equal. Accordingly, variations in thicknesses of the plated coatings are greatly reduced in the course of forming the above-described plated coatings by a wet type plating method.

Thus, the occurrence of defective components by sticking of electronic components caused by a larger thickness of the plated coatings located on the ends in the lengthwise direction is greatly reduced.

Also, materials for plating are conserved and therefore the cost for producing a surface mounting electronic component is greatly reduced in accordance with the reduction of variation in thickness of the plated coatings. Furthermore, the variation in appearance of surface mounting electronic components is also greatly reduced.

Similarly, variations in thicknesses of the plated coatings are greatly reduced and therefore, reduction in the frequency of the defective components and conservation of materials for plating can be realized as in the first preferred embodiment of the present invention, since the relationships: $S_1 < S_2 \approx S_3 \ldots \approx S_{n-1}$ and $S_n < S_2 \approx S_3 \ldots \approx S_{n-1}$, are established when n areas of external electrodes are represented by $S_1-S_n$, and the relationships: $L_1 > L_2 \approx L_3 \ldots \approx L_{n-1}$ and $L_n > L_2 \approx L_3 \ldots \approx L_{n-1}$ are established when the totals of the electrode lengths of sections of each external electrode located on the edges of the electronic component constituting member are represented by $L_1-L_n$, in the surface mounting electronic component according to the second preferred embodiment of the present invention obtained by the production method according to the fourth preferred embodiment of the present invention. Therefore, the cost of producing electronic components is greatly reduced. Furthermore, variation in configuration of the surface mounting electronic components finally obtained is also greatly reduced.

In the present preferred embodiment of the present invention, when notches are formed on the external electrodes at the both ends in the lengthwise direction of an electronic component constituting member, the thicknesses of plated coatings on the external electrodes located on the both ends in the lengthwise direction are more effectively reduced, and thus, variations in thicknesses of plated coatings regarding all of the external electrodes are further reduced.

When the above-described notches open toward the end surfaces of the electronic component constituting member, the thickness of the plated coatings on the external electrodes located on both ends in the lengthwise direction can be more effectively reduced. Thus, variations in thicknesses of plated coatings of all of the external electrodes are further reduced.

While the invention has been described with reference to preferred embodiments thereof, many modifications and variations of the present invention are possible in light of the above teachings. It is therefore to be understood that within the scope of the appended claims, the invention may be practiced otherwise than as specifically described.

What is claimed is:

1. A surface mounting electronic component, comprising:
   an electronic component constituting member having a top surface, a bottom surface, a pair of side surfaces and a pair of end surfaces; and
   a plurality of external electrodes disposed on the outer surfaces of said electronic component constituting member and including metallic coatings and plated coatings disposed on said metallic coatings, said plurality of external electrodes disposed at least on the bottom surface of the electronic component constituting member, and extending to reach the edges located between the bottom surface and the side surfaces; and
   respective ones of said plurality of external electrodes which are disposed near said end surfaces are located apart from each of the edges located between the end surfaces and the top surface, the bottom surface or the side surfaces so as not to extend onto said end surfaces; wherein
   each external electrode has approximately the same area, and the total of the electrode lengths of sections of each external electrode is approximately the same, in which the sections are located on each of the edges located between the side surfaces and the upper surface or the bottom surface of the electronic component constituting member; and
   notches are formed on the external electrodes at the ends in the lengthwise direction of said electronic component constituting member.

2. The surface mounting electronic component according to claim 1, wherein said notches are arranged to open toward said end surfaces on the top surface of the electronic component constituting member.

3. The surface mounting electronic component according to claim 1, wherein said electronic component constituting member is an electronic component body.

4. The surface mounting electronic component according to claim 1, wherein said electronic component constituting member is a packaging member arranged to mount an electronic component element on a surface thereof and to store an electronic component therein, and an electronic component element being one of mounted on and stored in said packaging member.

5. A surface mounting electronic component comprising:
   an electronic component constituting member having a top surface, a bottom surface, a pair of side surfaces and a pair of end surfaces; and
   n external electrodes, where n is a natural number, disposed on the outer surfaces of said electronic component constituting member and including metallic coatings and plated coatings disposed on said metallic coatings, each of said external electrodes is arranged at least on the bottom surface of the electronic component constituting member, and extends to reach the edges located between the bottom surface and the side surfaces, said n external electrodes being aligned in the lengthwise direction, the lengthwise direction being determined along the line made by connecting said pair of end surfaces of said electronic component constituting member, each area of the external electrodes is represented by $S_1-S_n$, with the relationships of $S_1<S_2\approx S_3 \ldots \approx S_{n-1}$ and $S_n<S_2\approx S_3 \ldots \approx S_{n-1}$; and the total of the electrode lengths of sections of each external electrode is represented by $L_1$–$L_n$, with the relationships of $L_1>L_2\approx L_3 \ldots \approx L_{n-1}$ and $L_n>L_2\approx L_3 \ldots \approx L_{n-1}$, in which the sections are located on each of the edges defined between the side surfaces and the upper surface or the bottom surface of the electronic component constituting member.

6. The surface mounting electronic component according to claim 5, wherein notches are formed on the external electrodes at the ends in the lengthwise direction of said electronic component constituting member.

7. The surface mounting electronic component according to claim 6, wherein said notches are arranged to open toward said end surfaces on the top surface of the electronic component constituting member.

8. The surface mounting electronic component according to claim 5, wherein said electronic component constituting member is an electronic component body.

9. The surface mounting electronic component according to claim 5, wherein said electronic component constituting member is a packaging member arranged to mount an electronic component element on a surface thereof and to store an electronic component therein, and an electronic component element being one of mounted on and stored in said packaging member.

* * * * *